US006551876B2

(12) United States Patent
Reinberg (10) Patent No.: US 6,551,876 B2
(45) Date of Patent: *Apr. 22, 2003

(54) PROCESSING METHODS OF FORMING AN ELECTRICALLY CONDUCTIVE PLUG TO A NODE LOCATION

(75) Inventor: Alan R. Reinberg, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/251,219

(22) Filed: Feb. 16, 1999

(65) Prior Publication Data

US 2001/0003669 A1 Jun. 14, 2001

Related U.S. Application Data

(63) Continuation of application No. 08/808,603, filed on Feb. 28, 1997, now Pat. No. 5,872,048.

(51) Int. Cl.$^7$ .......................................... H01L 21/8242
(52) U.S. Cl. ...................... 438/254; 438/279; 438/397; 438/587; 438/595; 438/672
(58) Field of Search ................................ 438/254, 279, 438/397, 584, 587, 595, 672

(56) References Cited

U.S. PATENT DOCUMENTS 5,053,351 A * 10/1991 Fazan et al. ................ 438/240
5,084,406 A    1/1992 Rhodes et al. .............. 438/256
5,296,400 A *  3/1994 Park et al. .................. 438/253

(List continued on next page.)

OTHER PUBLICATIONS

Merriam Webster's Collegiate Dictionary—10$^{th}$ Edition, Copyright 1996 3 pages (p. 1185).

(List continued on next page.)

Primary Examiner—Stephen D. Meier
Assistant Examiner—Maria Guerrero
(74) Attorney, Agent, or Firm—Wells St. John P.S.

(57) ABSTRACT

Methods of forming electrical connections with an integrated circuitry substrate node location are described. According to one aspect of the invention, a substrate node location is laterally surrounded with insulating material and left outwardly exposed. Conductive material is deposited over the exposed node location. Subsequently, a photomaskless etch of the conductive material is conducted to a degree sufficient to leave a plug of conductive material over the node location. In a preferred implementation, the insulating material with which such node location is surrounded constitutes insulating material portions which are provided relative to conductive lines which are formed over the substrate. In another preferred implementation, such conductive lines form a grid of insulating material which, in turn, defines the node location. According to a preferred aspect of the invention, a plurality of insulated conductive lines are formed over a substrate. At least some of the conductive lines constitute word lines and at least some of the conductive lines constitute bit lines. The lines are preferably formed to define and laterally surround an active area substrate location. The substrate location is preferably surrounded by at least four of the lines. Conductive material is deposited over the substrate and the conductive lines and in electrical contact with the node location. The conductive material is then removed to a degree sufficient to form an isolated plug of conductive material over the node location and between the four conductive lines.

31 Claims, 8 Drawing Sheets

U.S. PATENT DOCUMENTS

| | | | |
|---|---|---|---|
| 5,338,700 A | | 8/1994 | Dennison et al. ............ 438/253 |
| 5,340,763 A | * | 8/1994 | Dennison .................... 438/396 |
| 5,354,705 A | | 10/1994 | Mathews et al. ........... 438/397 |
| 5,488,011 A | | 1/1996 | Figura et al. ................ 438/253 |
| 5,496,773 A | | 3/1996 | Rhodes et al. .............. 438/626 |
| 5,605,857 A | | 2/1997 | Jost et al. ................... 438/253 |
| 5,773,341 A | * | 6/1998 | Green et al. ................ 438/253 |
| 6,214,663 B1 | * | 4/2001 | Cho et al. ................... 438/253 |

OTHER PUBLICATIONS

Sakao, M., et al., "A Capacitor–Over–Bit–Line (COB) Cell With A Hemispherical–Grain Storage Node For 64Mb DRAMs", Microelectronic Research Laboratories, NEC Corporation, 1990, pp. 27.3.1–27.3.4.

*Merriam Webster's Collegiate Dictionary—10$^{th}$ Edition*, Principal Copyright 1993, 2 pages (pp. 657 and 1187 ).

* cited by examiner

PROCESSING METHODS OF FORMING AN ELECTRICALLY CONDUCTIVE PLUG TO A NODE LOCATION

RELATED PATENT DATA

This patent resulted from a continuation application of U.S. patent application Ser. No. 08/808,603, filed Feb. 28, 1997, entitled "Processing Methods of Forming an Electrically Conductive Plug to a Node Location", naming Alan R. Reinberg as inventor, and which is now U.S. Pat. No. 5,872,048 the disclosure of which is incorporated by reference.

TECHNICAL FIELD

This invention concerns processing methods of forming an electrically conductive plug to a node location. This invention also concerns methods of forming an electrical connection with an integrated circuit memory cell node location.

BACKGROUND OF THE INVENTION

Fabrication of integrated circuitry typically involves forming electrical connections to substrate node locations. In the context of integrated circuit memory devices, such as dynamic random access memory devices, such electrical connections include those which are made to and between storage capacitors and substrate diffusion regions.

In the past, there have been at least two ways to make such electrical connections. A first way of forming such electrical connections involves depositing a thick insulator material, such as borophosphosilicate glass, over the substrate and then conducting a self-aligned etch thereof to form a contact opening. The contact opening, or at least a portion thereof, is subsequently filled with conductive material. As aspect ratios of such contact openings increase, it becomes more challenging to form such openings and electrical connections. A second way of forming such electrical connections involves depositing a conductive material over the entire substrate, patterning and etching such material to define desired electrical connections, and subsequently forming an insulating dielectric layer over the substrate. Contact openings can then be etched through the dielectric layer. Again, challenges are posed with respect to etching the contact openings through the dielectric layer.

This invention grew out of concerns associated with improving the manner in which electrical connections are made to or with integrated circuit substrate node locations. This invention also grew out of concerns associated with improving the manner in which electrical connections are made with integrated circuit memory cell node locations.

SUMMARY OF THE INVENTION

Methods of forming electrical connections with an integrated circuit substrate node location are described. According to one aspect of the invention, a substrate node location is laterally surrounded with insulating material and left outwardly exposed. Conductive material is deposited over the exposed node location. Subsequently, a photomaskless etch of the conductive material is conducted to a degree sufficient to leave a plug of conductive material over the node location. In a preferred implementation, the insulating material. with which such node location is surrounded constitutes insulating material portions which are provided relative to conductive lines which are formed over the substrate. In another preferred implementation, such conductive lines form a grid of insulating material which, in turn, defines the node location. According to a preferred aspect of the invention, a plurality of insulated conductive lines are formed over a substrate. At least some of the conductive lines constitute word lines and at least some of the conductive lines constitute bit lines. The lines are preferably formed to define and laterally surround an active area substrate location. The substrate location is preferably surrounded by at least four of the lines. Conductive material is deposited over the substrate and the conductive lines and in electrical contact with the node location. The conductive material is then removed to a degree sufficient to form an isolated plug of conductive material over the node location and between the four conductive lines.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
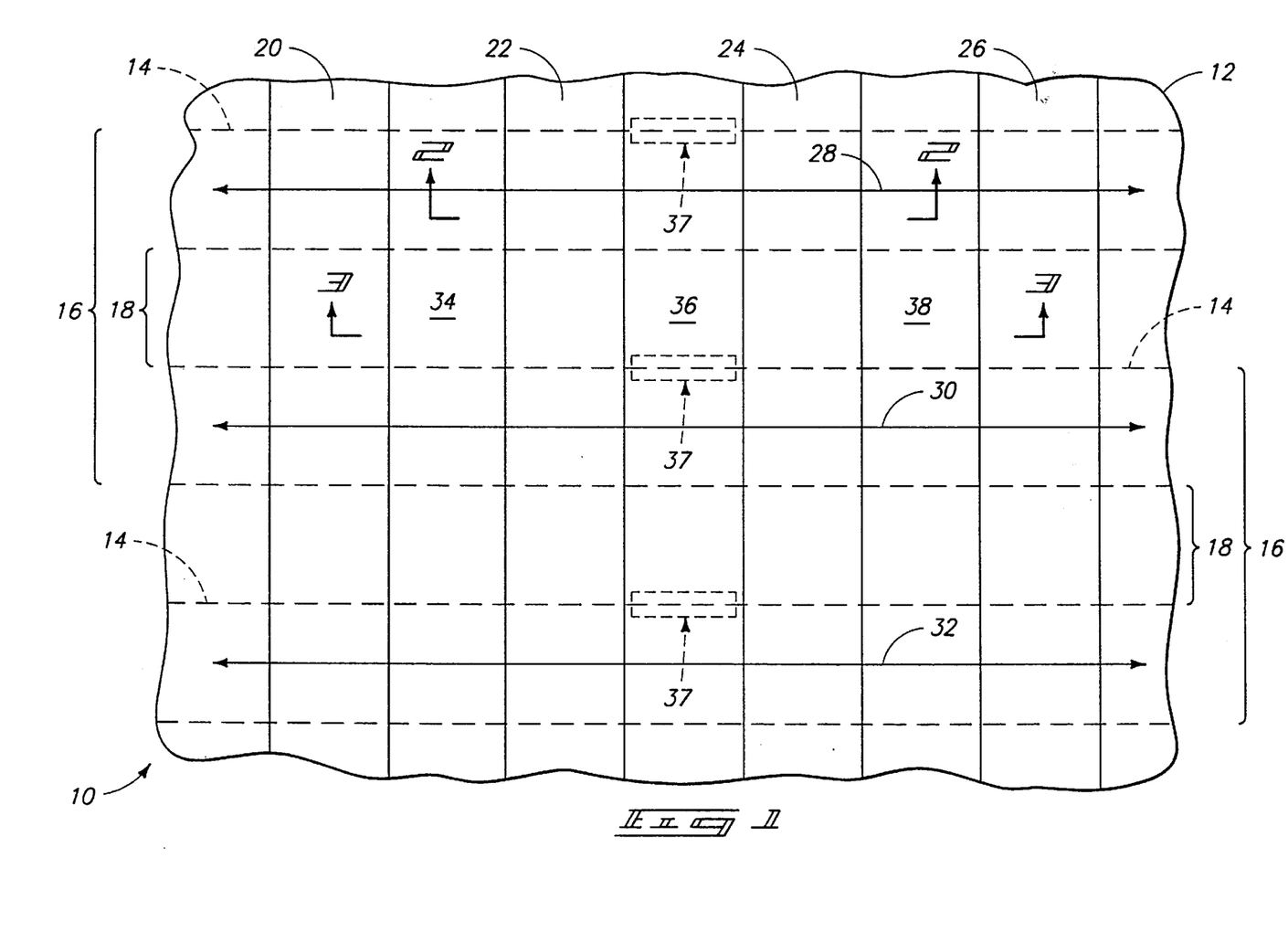
FIG. 1 is a top plan view of a semiconductor wafer fragment at one processing step in accordance with the invention.

Referring to FIG. 1, a semiconductor wafer fragment is shown generally at 10 and comprises a semiconductive substrate 12. In the context of this document, the term "semiconductive substrate" is defined to mean any construction comprising semiconductive material, including, but not limited to bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In the preferred embodiment, substrate 12 comprises an integrated circuit memory array area and a peripheral area. For purposes of the discussion herein, only a portion of the memory array area is shown.

A plurality of isolation oxide runners 14 are formed within substrate 12. One method of forming such runners is by trench and refill techniques in which substrate portions are etched away and back-filled with isolation oxide. Subsequent planarization provides the illustrated isolation oxide runners. Respective pairs of runners such as pairs 16 define continuous active areas or regions therebetween, such as respective active areas or regions 18. Active areas or regions 18 constitute continuous active areas which are formed within or relative to substrate 12. A plurality of laterally spaced apart insulative conductive lines 20, 22, 24, and 26, at least some of which are word lines, are form ed over substrate 12 and disposed generally transverse individual isolation oxide runners 14. The illustrated conductive lines are formed, in the preferred embodiment, to have respective insulative or insulating sidewall spacers (shown in FIG. 2 but not specifically designated) and insulative or insulating caps (shown in FIG. 2 but not specifically designated).

Conductive lines 20, 22, 24, and 26 constitute a first series of conductive lines which are formed relative to substrate 12. In the illustrated and preferred embodiment, substrate 12 supports integrated circuitry which forms memory cells. Even more preferably, such memory cells constitute dynamic random access memory cells. Accordingly, word line pair 22, 24 share an intervening contact of adjacent pairs of memory cells, which in turn share a diffusion region (described below) in substrate 12. Electrical isolation between the adjacent pairs of memory cells is provided by intervening conductive isolation lines 20, 26 which are formed in conjunction with the formation of word lines 22, 24. Lines 20, 26 in operation are connected with ground or a suitable negative voltage and effectively substitute for the electrical isolation formerly provided by field oxide.

Figure 2:
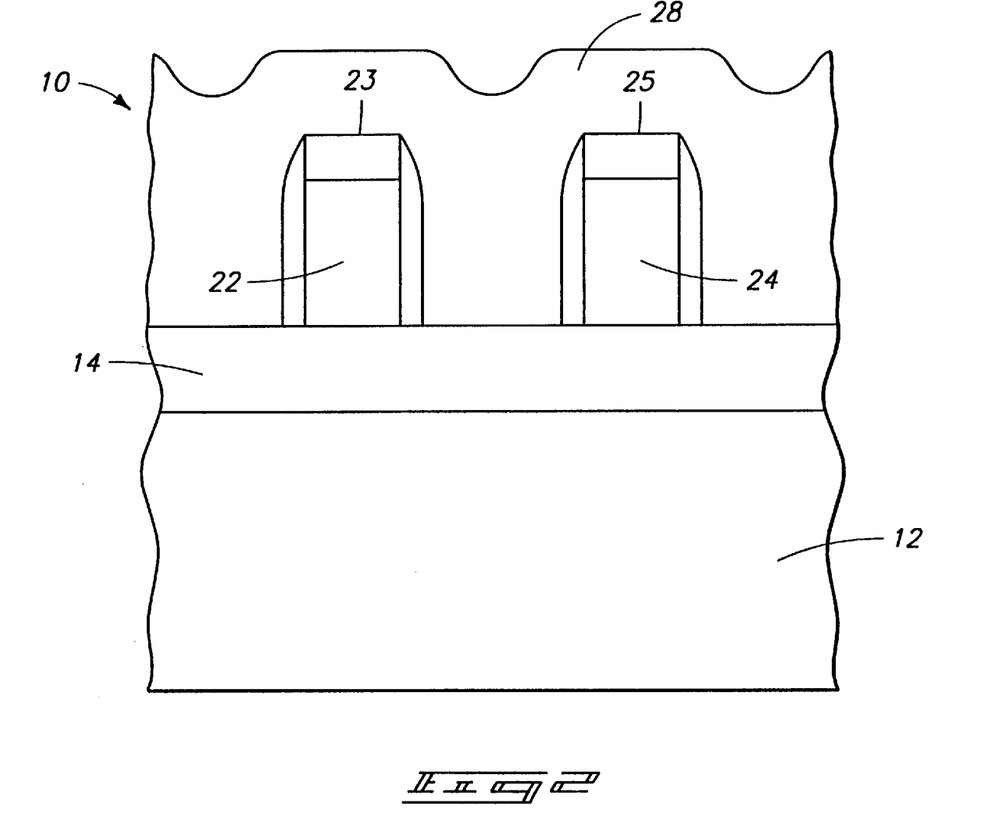
FIG. 2 is a view of the FIG. 1 wafer fragment taken along line 2—2 in FIG. 1.
Figure 3:
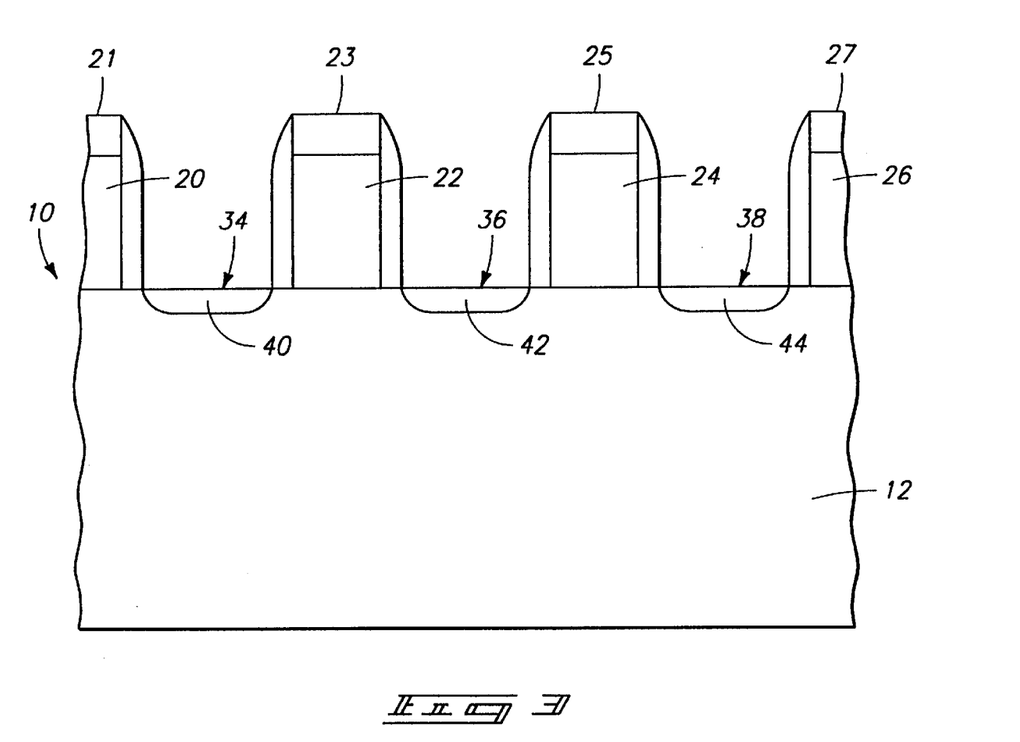
FIG. 3 is a view of the FIG. 1 wafer fragment taken along line 3—3 in FIG. 1.

Referring to FIGS. 1–3, conductive lines 20, 22, 24, and 26 have respective conductive line tops 21, 23, 25, and 27. Such line tops are defined by the insulating or insulative caps mentioned above. A plurality of laterally spaced apart insulated conductive memory cell bit lines 28, 30, and 32 are formed elevationally outwardly of conductive lines 20, 22, 24, and 26 and their respective conductive line tops, and are disposed generally transverse relative to the word lines. For purposes of illustration and clarity, the bit lines are indicated in FIG. 1 as a second series of parallel lines at least portions of which are disposed elevationally over the first series lines 20, 22, 24, and 26. In the illustrated and preferred embodiment, individual bit lines are formed elevationally over respective individual isolation oxide runners 14 as best shown in FIG. 2 for bit line 28 in corresponding extent and shape.

As formed, the first and second series of conductive lines collectively constitute a plurality of upstanding devices, with individual conductive word/isolation lines and bit lines constituting a grid of insulated lines which are formed relative to substrate 12.

Referring to FIGS. 1 and 3, a plurality of node locations 34, 36, and 38 with which electrical connection is desired are defined by the grid of upstanding devices and between conductive line pairs 20, 22, and 22, 24, and 24, 26 which are formed elevationally outwardly thereof. Although only three node locations are shown for purposes of illustration, other node locations are formed over the array area defined by substrate 12. In the illustrated and preferred embodiment, node locations 34, 36, and 38 constitute respective diffusion regions 40, 42, and 44 which are outwardly exposed. As formed, node locations 34, 36, and 38 also constitute first substrate locations which are laterally surrounded with insulating material. In the illustrated example, such insulating material constitutes insulative portions of first series conductive lines 20, 22, 24, and 26, and second series conductive bit lines 28, 30, and 32 which are formed elevationally outwardly of and generally transverse relative to conductive lines 20, 22, 24, and 26. In the illustrated and preferred embodiment, the conductive word/isolation and bit lines are formed to define an adjacent active area substrate location (corresponding to respective node locations 34, 36, and 38) which is laterally surrounded by four of the insulated conductive lines. In this example, two of such lines constitute first series lines, and two of such lines constitute second series lines. As used herein, the term "surround" is defined to mean "to enclose on all sides".

In the illustrated example, a mask can and preferably is utilized to define and expose a plurality of areas 37 (FIG. 1) proximate respective bit lines 28, 30, and 32. Areas 37 constitute areas which laterally expose respective sidewall spacers over the diagrammatically illustrated bit lines 28, 30, and 32. Typically, such sidewall spacers are formed from an oxide or nitride material. In a preferred embodiment, the sidewall spacers of conductive lines 20, 22, 24, and 26 comprise a nitride material while those of bit lines 28, 30, and 32 comprise an oxide material. The exposed sidewall portions 37 of bit lines 28, 30, and 32 are etched in a wet etch comprising HF at a substantially higher rate than the nitride material sidewalls of conductive lines 20, 22, 24, and 26. Accordingly, such enables contact to be made relative to the bit lines without appreciably etching any inadvertently exposed sidewall material of conductive lines 20, 22, 24, and 26.

Figure 4:
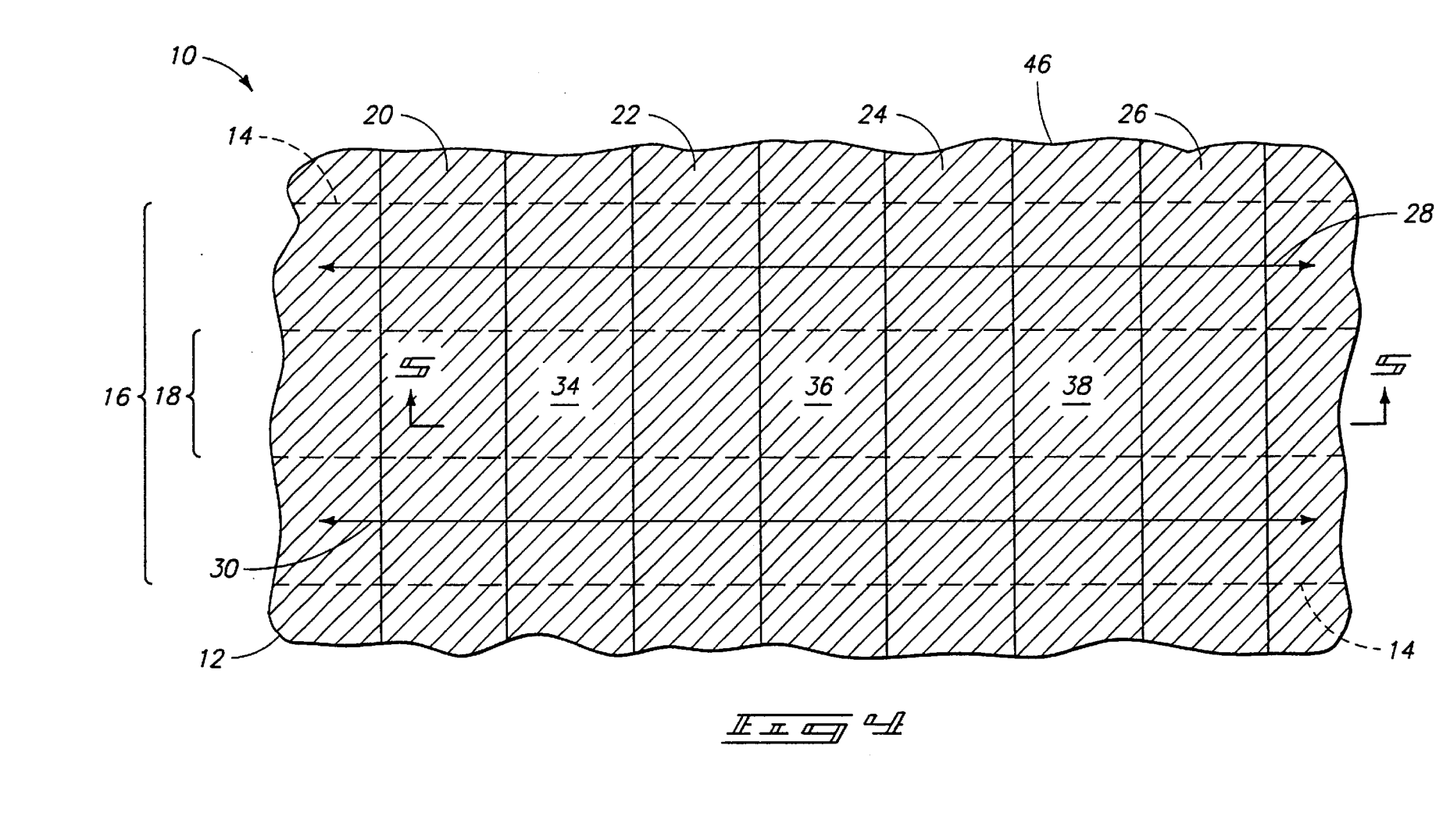
FIG. 4 is a view of a portion of the FIG. 1 wafer fragment at a processing step subsequent to that shown by FIG. 1.
Figure 5:
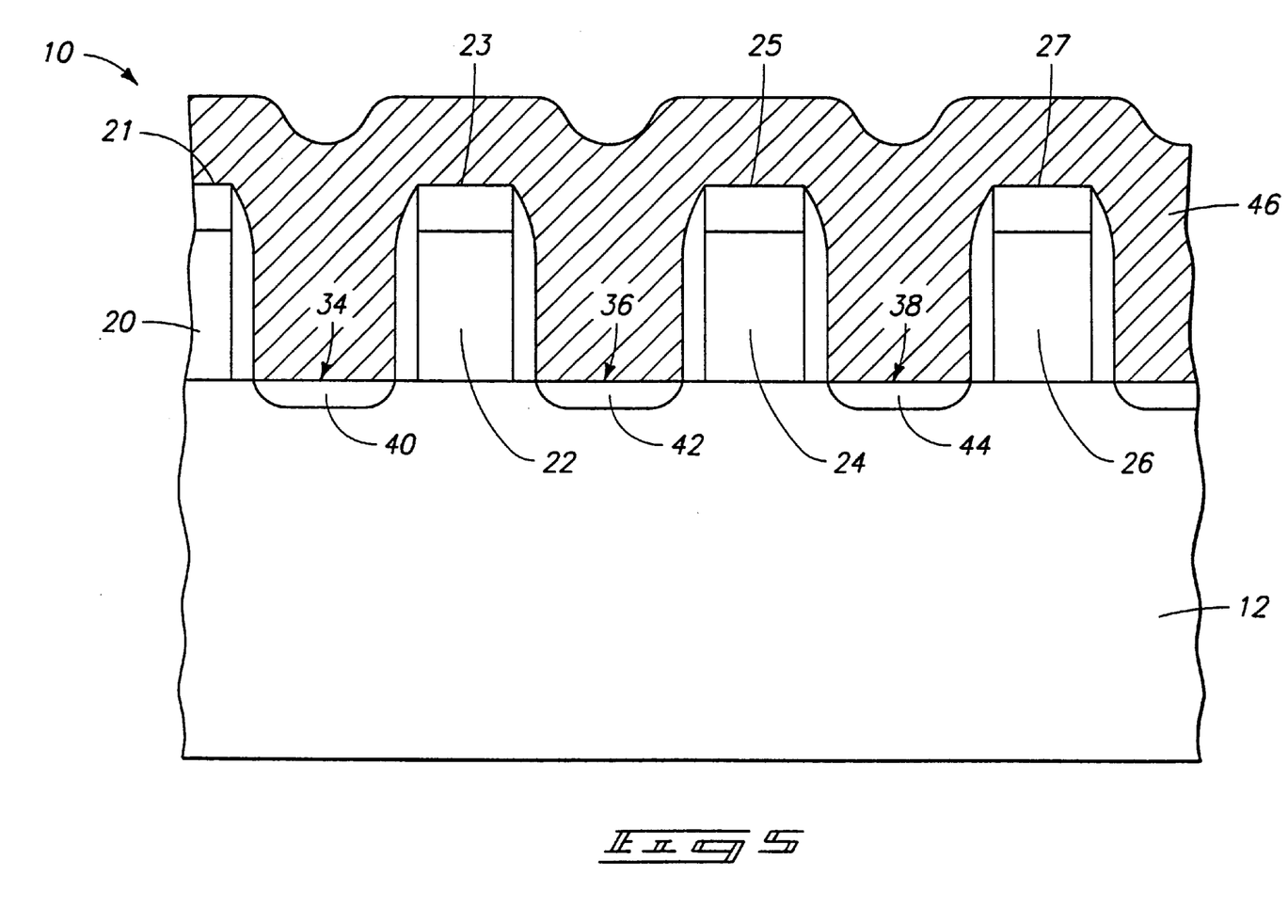
FIG. 5 is a view of the FIG. 4 wafer fragment taken along line 5—5 in FIG. 4.

Referring to FIGS. 4 and 5, a fragmentary portion of the FIG. 1 substrate is shown. After node locations 34, 36, and 38 are surrounded with the preferred insulating material and with the bit line conductive sidewall portions being effectively exposed, conductive material 46 is formed or deposited over the grid and the exposed node locations. Exemplary materials for conductive material 46 are polysilicon, tungsten, and the like. Preferably, such conductive material is chemical vapor deposited to achieve a degree of conformal coverage. Accordingly, conductive material 46 is deposited over the conductive lines and in electrical connection with the respective node locations as shown in FIG. 5. Conductive material 46 is also preferably in contact with the exposed portions of the bit line sidewalls corresponding to areas 37 (FIG. 1), thereby forming an electrical connection with node location 36, which, in turn, will form a connection through a word line/gate with a storage node location described below. In the preferred embodiment, a desired amount of conductive material can be less than the height of adjacent conductive lines, but an amount which is sufficient to fill the spaces between the lines.

Figure 6:
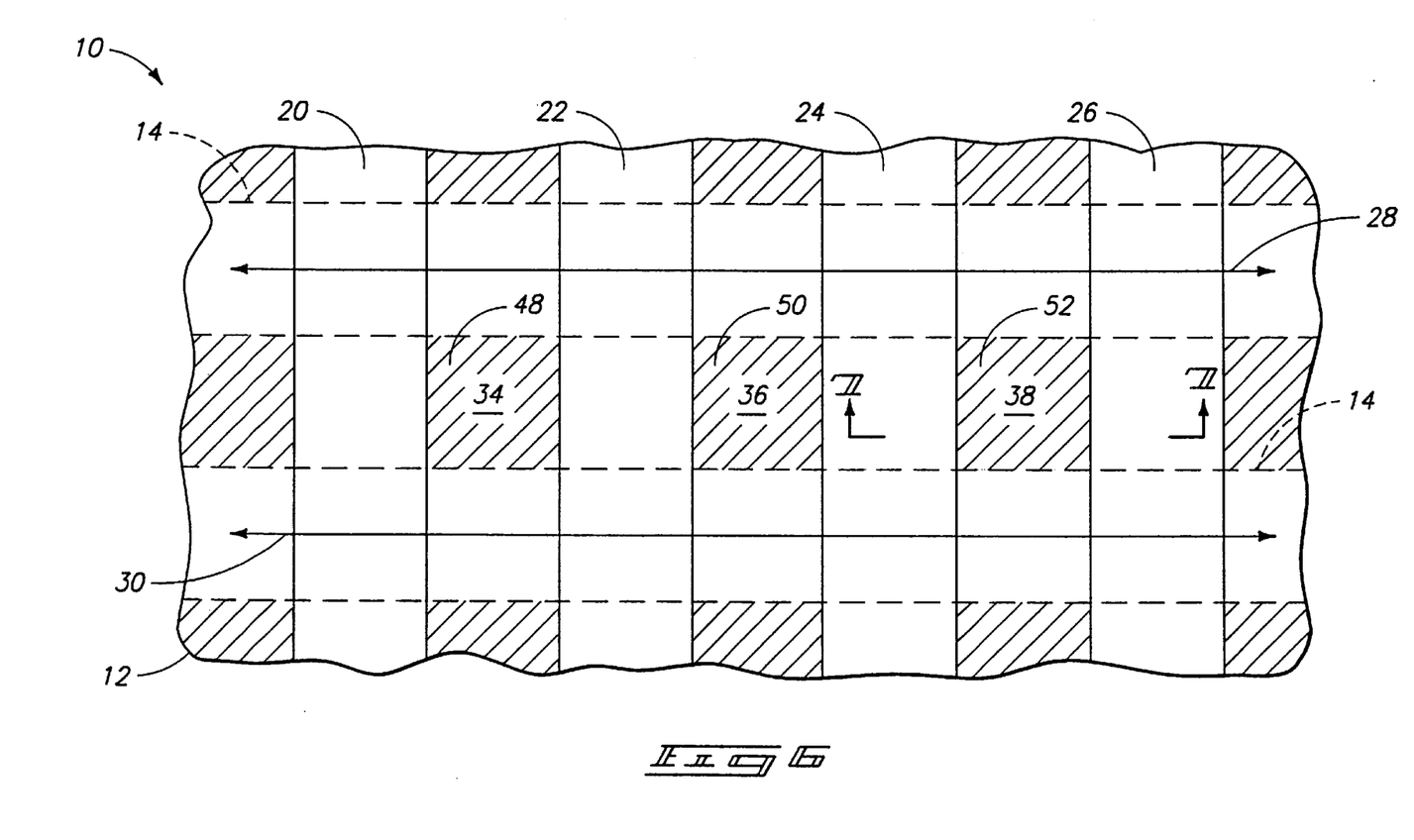
FIG. 6 is a view of the FIG. 4 wafer fragment at a processing step subsequent to that shown by FIG. 4.
Figure 7:
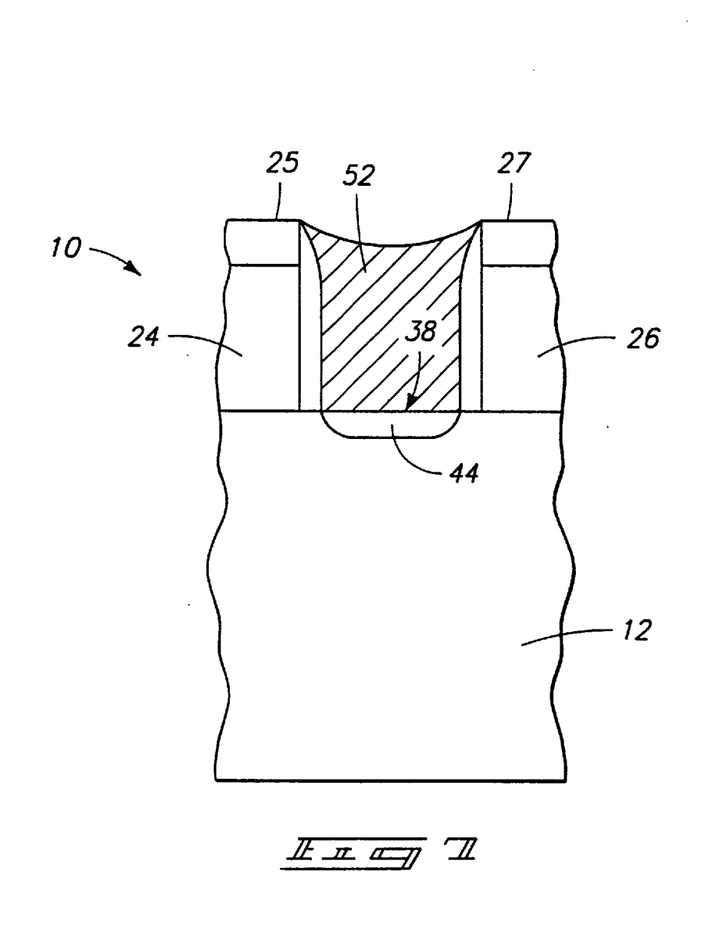
FIG. 7 is a view of a portion of the FIG. 6 wafer fragment taken along line 7—7 in FIG. 6.

Referring to FIGS. 6 and 7, conductive material 46 is removed to a degree sufficient to form isolated plugs 48, 50, and 52 of conductive material (FIG. 6) respectively, over node locations 34, 36, and 38. Plug 52 is shown in its cross-sectional entirety in FIG. 7. In the illustrated and preferred embodiment, a photomaskless etch is conducted of conductive material 46 (FIG. 5) to a degree which is sufficient to remove the conductive material from elevationally outward of the insulating material constituting portions of the conductive lines, and to a degree which is sufficient to leave plugs 48, 50, and 52 over respective node locations 34, 36, and 38. Accordingly, the photomaskless etch constitutes an etch which is conducted in the absence of any photomasking material laterally proximate the node location. Even more preferably, such etch is conducted in the absence of any photomasking material over the substrate. The photomaskless etch desirably permits conductive material to be removed from outside or outwardly of the illustrated array area without the need for a mask in or over the array area. The preferred etching of conductive material 46 constitutes an isotropic etch of the material to a degree sufficient to completely remove conductive material from over the conductive word/isolation lines, and to expose the insulating material portions of lines 24, 26. Exemplary etches include wet or dry etches, with the latter being preferred. Further, exemplary dry etch chemistries can include one or more of the following: $CF_4$, $SF_6$, or $NF_3$. Accordingly, the conductive material constituting plug 52 is preferably recessed to elevationally below uppermost surfaces or line tops 25, 27.

Figure 8:
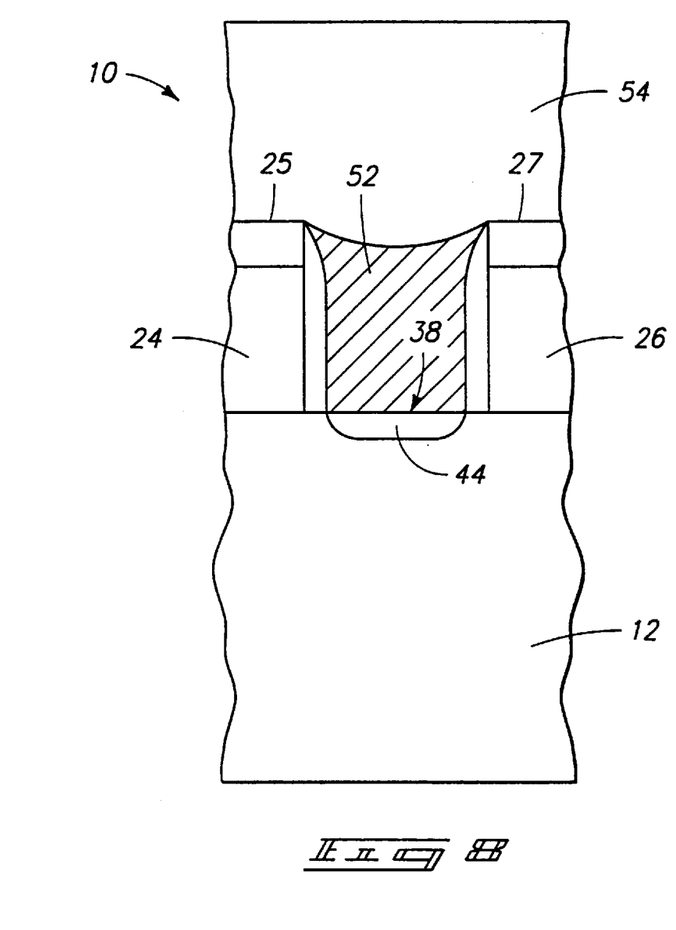
FIG. 8 is a view of the FIG. 7 wafer fragment at a processing step subsequent to that shown by FIG. 7.

Referring to FIG. 8, a layer 54 is formed over substrate 12. Preferably, layer 54 comprises an insulating or insulative material such as borophosphosilicate glass which is formed over the substrate. An exemplary thickness for layer 54 is 0.5 $\mu$m to 1.5 $\mu$m.

Figure 9:
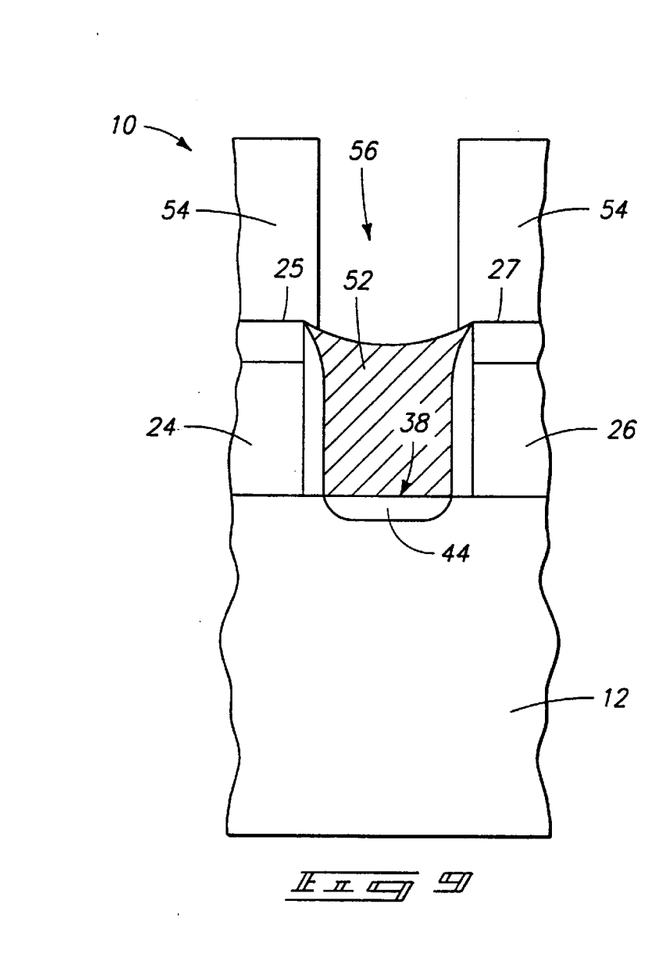
FIG. 9 is a view of the FIG. 7 wafer fragment at a processing step subsequent to that shown by FIG. 8.

Referring to FIG. 9, an opening 56 is etched or otherwise formed through insulative layer 54 to outwardly expose conductive material of plug 52 overlying node location 38. Preferably such opening is anisotropically etched to outwardly expose plug 52.

Figure 10:
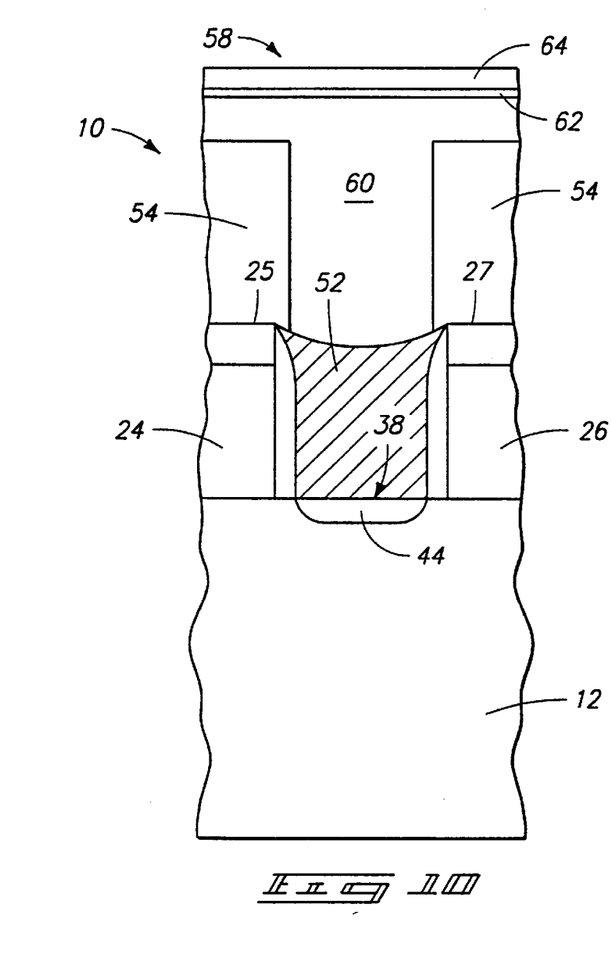
FIG. 10 is a view of the FIG. 7 wafer fragment at a processing step subsequent to that shown by FIG. 9.

Referring to FIG. 10, a second, spaced apart substrate location 58 is formed elevationally outward of and in electrical contact with the first substrate location defined by node location 38. In the illustrated and preferred embodiment, the spaced apart first and second substrate locations constitute part of an integrated circuitry memory cell and substrate location 58 constitutes a storage capacitor having a storage node 60, a dielectric layer 62, and cell plate 64. In the illustrated example, at least a portion of the storage capacitor is disposed elevationally outwardly, above or over the previously formed bit lines 28, 30, and 32 (FIG. 1). Accordingly, such constitutes a capacitor over-bit-line dynamic random access memory cell. Other integrated circuit first and second substrate locations are possible, including ones which are not necessarily associated with the above described integrated circuit memory cells.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an electrically conductive plug to a node location comprising:
    providing a node location to which electrical connection is to be made;
    forming a plurality of conductive lines having individual insulative sidewall spacers at least some of which laterally surround the node location;
    depositing conductive material over the surrounded node location and in electrical contact therewith; and
    removing at least some of the conductive material to leave a plug of conductive material over the node location.

2. The method of claim 1, wherein the forming of the plurality of conductive lines comprises doing so in separate conductive line-forming steps.

3. The method of claim 1, wherein the forming of the plurality of conductive lines comprises doing so in two conductive line-forming steps.

4. The method of claim 1, wherein the forming of the plurality of conductive lines comprises forming at least one of the conductive lines at a first substrate elevation, and forming at least another of the conductive lines at a different substrate elevation.

5. The method of claim 1, wherein the forming of the plurality of conductive lines comprises:
    forming a first pair of conductive lines to extend along a first direction; and
    forming a second pair of the conductive lines to extend along a second direction.

6. The method of claim 5, wherein the first and second pairs of conductive lines extend in different directions.

7. The method of claim 5, wherein the first and second pairs of conductive lines extend in directions which are generally orthogonal to one another.

8. The method of claim 5, wherein the first and second pairs of conductive lines are formed at different substrate elevations relative to one another.

9. The method of claim 5, wherein the first and second pairs of conductive lines are formed at different substrate elevations relative to one another, and the first and second pairs of conductive lines extend in directions which are generally orthogonal to one another.

10. A method of forming an electrically conductive plug to a node location comprising:
    providing a node location to which electrical connection is to be made;
    forming a first pair of conductive lines adjacent the node location, at least portions of the first pair of conductive lines being insulated with a first insulating material;
    forming a second pair of conductive lines over the first pair of conductive lines proximate the node location, at least portions of the second pair of conductive lines being insulated with a second insulating material, the first and second pairs of conductive lines laterally surrounding the node location;
    opening a window which overlaps with the node location and a portion of one of the conductive lines of the second pair of conductive lines;
    removing material within the window, including at least some of the second insulating material which insulates the one conductive line sufficient to expose some conductive material of the one conductive line; and
    forming conductive material over the node location and the exposed conductive material of the one conductive line.

11. The method of claim 10, wherein the first and second insulating materials comprise different materials.

12. The method of claim 10, wherein the first and second pairs of conductive lines extend in different directions.

13. The method of claim 10, wherein the first and second pairs of conductive lines extend in directions which are generally orthogonal to one another.

14. The method of claim 10, wherein the first pair of conductive lines comprise word lines in a memory array, and the second pair of conductive lines comprise bit lines in the memory array.

15. The method of claim 10, wherein the first pair of conductive lines comprise word lines in a capacitor-over-bit line memory array, and the second pair of conductive lines comprise bit lines in the capacitor-over-bit line memory array.

16. The method of claim 10, wherein the removing of the material within the window comprises using an etch chemistry which removes the second insulating material faster than the first insulating material.

17. A method of forming an electrically conductive plug to a node location comprising:

forming a first insulated conductive line over a substrate and adjacent a node location with which electrical connection is to be made;

forming a second insulated conductive line proximate the first insulated conductive line;

forming a third insulated conductive line proximate the second insulated conductive line;

forming a fourth insulated conductive line proximate the third insulated conductive line; wherein the first, second, third, and fourth insulated conductive lines are arranged to laterally surround the node location with insulating material; and forming a conductive material over the substrate and in electrical contact with the node location.

18. The method of claim 17 further comprising prior to forming the conductive material over the substrate, removing portions of at least one of the third and fourth insulated conductive lines to expose a conductive portion thereof, and wherein the forming of the conductive material comprises placing the exposed conductive portion of the one third or fourth insulated conductive line into electrical communication with the node location.

19. The method of claim 17, wherein the first and second insulated conductive lines are formed at the same time.

20. The method of claim 17, wherein the third and fourth insulated conductive lines are formed at the same time.

21. The method of claim 17, wherein the first and second insulated conductive lines are formed at the same time, and the third and fourth insulated conductive lines are formed at a time which is different from the time at which the first and second insulated conductive lines are formed.

22. The method of claim 17 further comprising prior to forming the conductive material over the substrate:

opening a window over one of the third and fourth insulated conductive lines which also overlaps with a portion of the node location; and removing material within the window sufficient to expose a conductive portion of the one insulated conductive line; and wherein the forming of the conductive material comprises placing the exposed conductive portion of the one third or fourth insulated line into electrical communication with the node location.

23. A method of forming an electrically conductive plug to a node location on a substrate comprising:

providing a node location to which electrical connection is to be made, providing including forming a series of isolation structures extending in a first direction in a plane of a surface of the substrate configured to provide a series of active area regions therebetween, the series of isolation structures being configured to isolate active areas from one another;

forming a first plurality of conductive lines having individual insulative sidewall spacers, the first plurality extending along a second direction different from the first direction in the plane, the first plurality being configured to cooperate with the series of isolation structures to selectively isolate an individual portion of one of the active areas from other, adjacent portions of the one active area, a first conductive line of the first plurality being formed on a first side of the node location, a second conductive line of the first plurality being formed on a second side of the node location opposed to the first side and parallel to the first conductive line;

forming a second plurality of conductive lines having individual insulative sidewall spacers atop the first plurality and extending along the first direction in the plane, a first conductive line of the second plurality extending along a third side of the node location extending between the first and second sides thereof, a second conductive line of the second plurality extending along a fourth side of the node location extending between the first and second sides thereof and opposed to the third side, the first and second conductive lines of the first and second pluralities cooperating to surround the node location in the plane of the surface;

depositing conductive material over the surrounded node location and in electrical contact therewith; and removing at least some of the conductive material to leave a plug of conductive material over the node location.

24. The method of claim 23, wherein the first and second pluralities of conductive lines extend in directions which are generally orthogonal to one another.

25. The method of claim 23, wherein the first plurality of conductive lines comprise word lines in a memory array, and the second plurality of conductive lines comprise bit lines in the memory array.

26. The method of claim 23, wherein the first plurality of conductive lines comprise word lines in a capacitor-over-bit line memory array, and the second plurality of conductive lines comprise bit lines in the capacitor-over-bit line memory array.

27. A method of forming an electrically conductive plug to a node location comprising:

forming a first insulated conductive line over a substrate and adjacent a node location with which electrical connection is to be made;

forming a second insulated conductive line proximate the first insulated conductive line;

forming a third insulated conductive line proximate the second insulated conductive line;

forming a fourth insulated conductive line proximate the third insulated conductive line; wherein the first, second, third, and fourth insulated conductive lines are arranged to laterally surround the node location on all sides with insulating material; and forming a conductive material over the substrate and in electrical contact with the node location.

28. The method of claim 27, wherein the first and second insulated conductive lines are formed at the same time, and the third and fourth insulated conductive lines are formed at a time which is different from the time at which the first and second insulated conductive lines are formed.

29. The method of claim 27 further comprising prior to forming the conductive material over the substrate, removing portions of at least one of the third and fourth insulated conductive lines to expose a conductive portion thereof, and wherein the forming of the conductive material comprises placing the exposed conductive portion of the one third or fourth insulated conductive line into electrical communication with the node location.

30. The method of claim 27, wherein the first and second insulated conductive lines are formed at the same time.

31. The method of claim 30, wherein the third and fourth insulated conductive lines are formed at the same time.

* * * * *

UNITED STATES PATENT AND TRADEMARK OFFICE
CERTIFICATE OF CORRECTION

PATENT NO.   : 6,551,876 B2                                              Page 1 of 1
DATED        : April 22, 2003
INVENTOR(S)  : Alan R. Reinberg It is certified that error appears in the above-identified patent and that said Letters Patent is hereby corrected as shown below:

Column 1,
Line 64, replace "material. with which such node location is surrounded" with
-- material with which such node location is surrounded --

Column 3,
Line 10, replace "at least some of which are word lines, are form ed over" with
-- at least some of which are word lines, are formed over --

Signed and Sealed this

Tenth Day of February, 2004

JON W. DUDAS
*Acting Director of the United States Patent and Trademark Office*